United States Patent
Wang

(10) Patent No.: US 10,128,453 B2
(45) Date of Patent: Nov. 13, 2018

(54) METHOD FOR MANUFACTURING A GRAPHENE THIN-FILM TRANSISTOR

(71) Applicant: WUHAN CHINA STAR OPTOELECTRONICS TECHNOLOGY CO., LTD., Wuhan (CN)

(72) Inventor: Xuanyun Wang, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 69 days.

(21) Appl. No.: 15/126,584

(22) PCT Filed: Apr. 1, 2016

(86) PCT No.: PCT/CN2016/078391
§ 371 (c)(1),
(2) Date: Sep. 16, 2016

(87) PCT Pub. No.: WO2017/156803
PCT Pub. Date: Sep. 21, 2017

(65) Prior Publication Data
US 2018/0097191 A1   Apr. 5, 2018

(30) Foreign Application Priority Data
Mar. 18, 2016 (CN) .......................... 2016 1 0156131

(51) Int. Cl.
*H01L 29/16* (2006.01)
*H01L 51/05* (2006.01)
(Continued)

(52) U.S. Cl.
CPC .......... *H01L 51/0558* (2013.01); *H01B 1/24* (2013.01); *H01L 21/205* (2013.01);
(Continued)

(58) Field of Classification Search
CPC ............. H01L 29/1606; H01L 29/4908; H01L 29/66045
See application file for complete search history.

(56) References Cited

U.S. PATENT DOCUMENTS

| | | | | |
|---|---|---|---|---|
| 5,731,856 A | * | 3/1998 | Kim | ...................... G02F 1/1345 349/147 |
| 8,492,753 B2 | * | 7/2013 | Yager | .................. C23C 16/0281 257/40 |

(Continued)

FOREIGN PATENT DOCUMENTS

| | | |
|---|---|---|
| CN | 103602964 A | 2/2014 |
| CN | 104030274 A | 9/2014 |
| CN | 105047562 A | 11/2015 |

*Primary Examiner* — Thao P Le
(74) *Attorney, Agent, or Firm* — JMB Davis Ben-David

(57) ABSTRACT

The present invention provides a method for manufacturing a graphene thin-film transistor, which includes: depositing a graphene layer on a surface of a copper foil; depositing a metal layer on a surface of the graphene layer; attaching a support layer to a surface of the metal layer to form a graphene film; placing the graphene film in a copper etching solution until the copper foil is dissolved completely, then transferring the graphene film to a target substrate, and removing the support layer; defining patterns of a source and a drain on the surface of the metal layer, manufacturing a source electrode and a drain electrode, and manufacturing a gate electrode on a target substrate.

18 Claims, 2 Drawing Sheets

(51) Int. Cl.
    *H01L 29/786*     (2006.01)
    *H01B 1/24*     (2006.01)
    *H01L 21/205*     (2006.01)
    *H01L 21/3065*     (2006.01)
    *H01L 27/32*     (2006.01)
    *H01L 29/66*     (2006.01)

(52) U.S. Cl.
    CPC .......... *H01L 21/3065* (2013.01); *H01L 27/32* (2013.01); *H01L 29/16* (2013.01); *H01L 29/1606* (2013.01); *H01L 29/66045* (2013.01); *H01L 29/786* (2013.01); *H01L 51/0512* (2013.01)

(56) References Cited

U.S. PATENT DOCUMENTS

| | | | |
|---|---|---|---|
| 2012/0220053 A1* | 8/2012 | Lee | H01L 29/4908 436/501 |
| 2014/0024211 A1 | 1/2014 | Ott et al. | |
| 2014/0193574 A1* | 7/2014 | Yeh | C01B 31/0453 427/122 |
| 2015/0144884 A1* | 5/2015 | Yamaguchi | H01L 29/1606 257/29 |
| 2015/0249034 A1* | 9/2015 | Kondo | H01L 29/66045 438/151 |
| 2015/0262724 A1* | 9/2015 | Naito | C23F 1/00 428/138 |
| 2016/0115032 A1* | 4/2016 | Wodtke | C01B 31/04 252/71 |
| 2017/0221996 A1* | 8/2017 | Park | H01L 29/1606 |
| 2018/0047814 A1* | 2/2018 | White | H01L 29/7781 |

\* cited by examiner

METHOD FOR MANUFACTURING A GRAPHENE THIN-FILM TRANSISTOR

CROSS-REFERENCE TO RELATED APPLICATIONS

This is the U.S. National Stage of International Patent Application No. PCT/CN2016/078391, filed Apr. 1, 2016, which in turn claims the benefit of China Patent Application No. 201610156131.8, filed Mar. 18, 2016.

BACKGROUND OF THE INVENTION

1. Field of the Invention

The present invention relates to the field of thin-film transistors, and particularly to a method for manufacturing a graphene thin-film transistor.

2. Description of the Prior Art

Graphene is a new material having good conductive performance and penetrability. With the development of touch screens, liquid crystal displays, and the like, graphene shows excellent mechanical strength and flexibility, so that it has gradually become a research focus in thin-film transistor applications.

At present, the method for manufacturing the graphene thin-film transistor mainly includes the steps of: growing graphene on a surface of a copper foil; coating an organic macromolecular material on a surface of the graphene, such as Polymeric Methyl Methacrylate (PMMA); placing a film composed of PMMA, graphene, and the copper foil in a copper etching solution to etch off the copper foil; then dissolving PMMA, and manufacturing a source and a drain on the surface of the graphene via photolithography technology and the like, thus forming a complete graphene thin-film transistor. However, in the conventional method for manufacturing the graphene thin-film transistor, the PMMA and the photoresist used for photolithography technology are in direct contact with the graphene. When dissolving the PMMA and the photoresist, a problem due to the PMMA and the photoresist remaining on the surface of the graphene appears. In the subsequent manufacture of the source and the drain, the source and the drain fail to be in complete contact with the surface of the graphene owing to the remaining PMMA and the photoresist. Thus, the contact resistance between the source, the drain, and the graphene is increased, the charge transport is limited, and a current in the thin-film transistor is decreased, so that the driving capability is reduced.

Therefore, it is necessary to provide a method for manufacturing the graphene thin-film transistor to solve a problem of the increased contact resistance due to the remaining organic macromolecular materials on the surface of the graphene in the conventional manufacturing method.

SUMMARY OF THE INVENTION

The embodiment of the invention provides a method for manufacturing a graphene thin-film transistor, to solve a problem of the increased contact resistance due to the remaining organic macromolecular materials on the surface of the graphene in the conventional manufacturing method.

The embodiment of the invention provides a method for manufacturing a graphene thin-film transistor, comprising:

S1: depositing a graphene layer on a surface of a copper foil by chemical vapor deposition using methane as a carbon source;

S2: depositing a metal layer on a surface of the graphene layer;

S3: attaching a support layer to a surface of the metal layer to form a graphene film;

S4: placing the graphene film in a copper etching solution, immersing the support layer in the copper etching solution partially, and immersing the metal layer, the graphene layer, and copper foil in the copper etching solution completely until the copper foil is dissolved completely, then transferring the graphene film, from which the copper foil has been removed, to a target substrate, and removing the support layer;

S5: defining patterns of a source and a drain on the surface of the metal layer, manufacturing a source and a drain electrode, and manufacturing a gate electrode at a side of the target substrate away from the graphene layer, to obtain a graphene thin-film transistor.

In the method for manufacturing the graphene thin-film transistor of the invention, before S1, the method further comprises: washing the copper foil in ethanol, acetone, and dilute hydrochloric acid of 0.5 mol/L sequentially.

In the method for manufacturing the graphene thin-film transistor of the invention, the metal layer is deposited on the surface of the graphene layer by electron beam evaporation or magnetron sputtering.

In the method for manufacturing the graphene thin-film transistor of the invention, the metal layer has a thickness of 5 nm-50 nm.

In the method for manufacturing the graphene thin-film transistor of the invention, the metal layer comprises a single metal layer or a composite metal layer.

In the method for manufacturing the graphene thin-film transistor of the invention, every one of the composite metal layer has the same thickness when the metal layer comprises the composite metal layer.

In the method for manufacturing the graphene thin-film transistor of the invention, the metal layer uses a metal including titanium, gold, nickel, palladium, or platinum.

In the method for manufacturing the graphene thin-film transistor of the invention, a density of the support layer is less than a density of the copper etching solution.

In the method for manufacturing the graphene thin-film transistor of the invention, the support layer comprises polyurethane.

In the method for manufacturing the graphene thin-film transistor of the invention, the target substrate comprises an insulation layer, wherein a material of the insulation layer includes silicon dioxide, silicon carbide, glass, or sapphire.

The embodiment of the invention provides a method for manufacturing a graphene thin-film transistor, the manufacturing method comprises:

S1: depositing a graphene layer on a surface of a copper foil;

S2: depositing a metal layer on a surface of the graphene layer;

S3: attaching a support layer to a surface of the metal layer to form a graphene film;

S4: placing the graphene film in a copper etching solution, immersing the support layer partially in the copper etching solution, and immersing the metal layer, the graphene layer, and copper foil in the copper etching solution completely until the copper foil is dissolved completely, then transferring the graphene film, from which the copper foil has been removed, to a target substrate, and removing the support layer;

S5: defining patterns of a source and a drain on the surface of the metal layer, manufacturing a source electrode and a drain electrode, and manufacturing a gate electrode at a side of the target substrate away from the graphene layer, to obtain a graphene thin-film transistor.

In the method for manufacturing the graphene thin-film transistor of the invention, before S1, further comprises: washing the copper foil in ethanol, acetone, and dilute hydrochloric acid of 0.5 mol/L sequentially.

In the method for manufacturing the graphene thin-film transistor of the invention, the graphene is deposited on the surface of the copper foil by the chemical vapor deposition.

In the method for manufacturing the graphene thin-film transistor of the invention, the metal layer is deposited on the surface of the graphene by electron beam evaporation or magnetron sputtering.

In the method for manufacturing the graphene thin-film transistor of the invention, the metal layer has a thickness of 5 nm-50 nm.

In the method for manufacturing the graphene thin-film transistor of the invention, the metal layer includes a single metal layer or a composite metal layer.

In the method for manufacturing the graphene thin-film transistor of the invention, the metal layer uses a metal including titanium, gold, nickel, palladium or platinum.

In the method for manufacturing the graphene thin-film transistor of the invention, a density of the support layer is less than a density of the copper etching solution.

In the method for manufacturing the graphene thin-film transistor of the invention, the support layer comprises polyurethane.

In the method for manufacturing the graphene thin-film transistor of the invention, the target substrate comprises an insulation layer, wherein a material of the insulation layer includes silicon dioxide, silicon carbide, glass, or sapphire.

To compare with the prior art, in the method for manufacturing the graphene thin-film transistor of the invention, by means of depositing the metal layer on the surface of the graphene layer, the graphene layer is protected, so that the graphene layer does not have direct contact with the supper layer and the photoresist, thus avoiding a problem of residuals appearing on the surface of the graphene, so that the source electrode and a drain electrode are in direct contact with the graphene layer and reducing contact resistance between the source electrode, the drain electrode, and the graphene. This solves a problem of the increased contact resistance between the source electrode and the drain electrode and the graphene due to the remaining PMMA and the photoresist on the surface of the graphene in the conventional manufacturing method.

BRIEF DESCRIPTION OF THE DRAWINGS

To illustrate the technical solutions in the embodiments of the present invention or in the prior art more clearly, accompanying drawings needed for describing the embodiments or the prior art are briefly introduced in the following. The accompanying drawings in the following description are only some embodiments of the present invention, and persons of ordinary skill in the art may obtain other accompanying drawings from these accompanying drawings without making creative efforts.

DETAILED DESCRIPTION OF THE PREFERRED EMBODIMENTS

Figure 1:
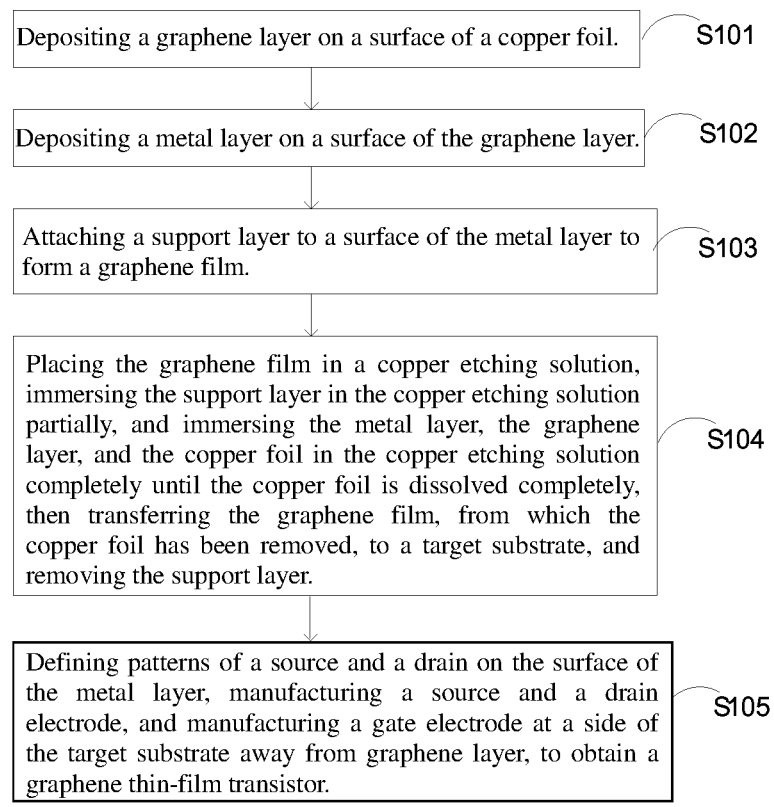
FIG. 1 is a flowchart of a method for manufacturing a graphene thin-film transistor according to a preferred embodiment of the present invention.

Please refer to FIG. 1. FIG. 1 is a flowchart of a method for manufacturing a graphene thin-film transistor according to one preferred embodiment of the present invention. The manufacturing method includes the following steps:

S101: depositing a graphene layer on a surface of a copper foil;

S102: depositing a metal layer on a surface of the graphene layer;

S103: attaching a support layer to a surface of the metal layer to form a graphene film;

S104: placing the graphene film in a copper etching solution, partially immersing the support layer in the copper etching solution, and completely immersing the metal layer, the graphene layer, and the copper foil in the copper etching solution until the copper foil is completely dissolved, then transferring the graphene film, from which the copper foil has been removed, to a target substrate, and removing the support layer;

S105: defining patterns of a source and a drain on the surface of the metal layer, manufacturing a source electrode and a drain electrode, and manufacturing a gate electrode at a side of the target substrate away from the graphene layer, to obtain a graphene thin-film transistor.

In S101, before depositing the graphene layer on the surface of the copper foil, a clearing operation for oil pollution, oxides, and other impurities on the surface of the copper foil is required. In a preferred embodiment of the present invention, the clearing operation comprises: washing the copper foil in ethanol, acetone, and dilute hydrochloric acid of 0.5 mol/L sequentially until the impurities on the surface of the copper foil are all removed, thereby the surface of the copper foil reaches the requirement for the process of growing the graphene.

In the preferred embodiment of the present invention, the graphene layer is deposited on the surface of the copper foil by chemical vapor deposition (CVD). The graphene made by CVD has the advantages of high quality and large growth area. Currently, CVD is the main method for manufacturing high-quality graphene. The principle thereof is to introduce one or more gaseous materials into a reaction chamber and a chemical reaction takes place, a new material is generated and deposited on the surface of the substrate.

In depositing the graphene layer by CVD, hydrogen can be selected as a non-oxidative gas to be introduced into the reaction chamber to remove an oxidative gas in the reaction chamber. Certainly, argon or other gases can also be used as the non-oxidative gas, it is not specifically limited herein. Methane is used as a carbon source. The carbon source may be other carbonaceous materials, such as carbon monoxide, acetylene, or the like, it is not specifically limited herein. Under a high-temperature and low-pressure environment, the steps of depositing the graphene layer on the surface of the copper foil is completed.

In S102, metal is deposited on the surface of the graphene layer by magnetron sputtering, to form the metal layer on the surface of the graphene layer. In other embodiments, the metal is deposited on the surface of the graphene layer by electron beam evaporation and the like technologies, which is not specifically limited herein.

In a preferred embodiment of the present invention, the metal layer is a composite metal layer including double metal layers, in which one metal layer close to the surface of the graphene layer is a titanium metal layer, and the other one metal layer away from the surface of the graphene layer is a gold metal layer. The advantage of arranging the titanium metal layer to be closer to the graphene layer is that bonding is easily generated between the titanium metal and the graphene, and the contact resistance between the titanium metal layer and the graphene layer can be further reduced.

Certainly, in other embodiments, the metal layer may be a single metal layer, it may also be a composite metal layer including three layers, four layers, or others. The metal or metals of the metal layer can be one or more of titanium, gold, nickel, palladium, and platinum. The number of metal layers and the types of the metal are not specifically limited herein.

It is necessary to control an injection amount of the metal when the metal layer is deposited on the surface of the graphene layer. That is, a thickness of the metal should be controlled. If the thickness of the metal layer is too small, it cannot protect the graphene layer well. If the thickness of the metal layer is too large, the support layer cannot suspend the metal layer, the graphene layer, and the copper foil in the copper etching solution, that is, the support layer will fall into the copper etching solution with the metal layer, the graphene layer, and the copper foil. This will cause inconvenience in the successive process. Thus, the thickness of the metal layer should be limited. The metal layer has the thickness of 5 nm-50 nm, generally. In a preferred embodiment of the present invention, the thickness of the metal layer is preferably 10 nm, and the thicknesses of the titanium metal layer and the gold metal layer are 5 nm, respectively.

In S103, the support layer is attached to the surface of the metal layer, a density of the support layer less than a destiny of the copper etching solution. The difference of the density of the support layer and the density of the copper etching solution should be as great as possible. By using the density difference between the support layer and the copper etching solution, the support layer is floated on a surface of the copper etching solution. In the subsequent step of dissolving the copper foil, the metal layer, the graphene layer, and the copper foil are suspended in the copper etching solution by the support layer, to prevent these layers from falling into the copper etching solution. In addition to the function above, it is convenient to transfer the graphene film, of which the copper foil has been removed, to the target substrate.

In a preferred embodiment of the present invention, the support layer comprises polyurethane. In other embodiments, the support layer may also comprise another material with a density less than the density of the copper etching solution, the material is not specifically limited herein.

Figure 2:
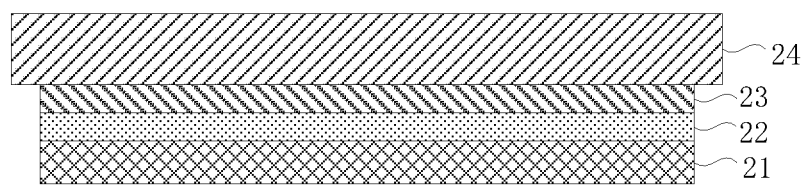
FIG. 2 is a schematic structure view of a graphene film in a method for manufacturing a graphene thin-film transistor according to the present invention.

For further description a structure of the graphene film clearly, please refer to FIG. 2, which is a schematic structure view of the graphene film in a method for manufacturing the graphene thin-film transistor according to the present invention. The graphene film sequentially includes, from bottom to top: the copper foil 21, the graphene layer 22, the metal layer 23, and the support layer 24.

In S104, the graphene film is placed in the copper etching solution. At this time, owing to the density of support layer less than the density of the copper etching solution, the support layer floats on the surface of the copper etching solution, and the metal layer, the graphene layer, and the copper foil are immersed in the copper etching solution. After the copper foil is completely etched off, the graphene film, from which the copper foil has be removed, is transferred to the target substrate, and then the support layer is removed.

In a preferred embodiment of the present invention, the target substrate includes an insulation layer. According to common knowledge, the graphene film is transferred to the insulation layer of the target substrate. The insulation layer comprises silicon dioxide, silicon carbide, glass, or sapphire materials nay also be used, the material is not specifically limited herein.

In S105, patterns of a source and a drain on the surface of the metal layer are defined by the photolithography technology, then the gold metal are deposited to positions corresponding to the patterns of the source and the drain via magnetron sputtering or electron beam evaporation technology. The metal layer in the channel region is etched off by dry etching technology to expose the graphene layer in the channel region. At the same time, a gate electrode is manufactured at a side of the target substrate away from the graphene layer. Since the steps of the methods for manufacturing source, drain, and gate are conventional techniques, and are common knowledge to one of ordinary skills in the art, the steps are not redundantly described herein. After completion of the step S105, a graphene thin-film transistor having a low contact resistance is obtained.

In the conventional method for manufacturing the graphene thin-film transistor, the patterns of the source and the drain are directly defined on the surface of the graphene layer by photolithography technology. A thin layer of titanium metal and a thick layer of gold metal are deposited in the positions corresponding to the patterns of the source and the drain through magnetron sputtering or electron beam evaporation technologies, and thereby forming the source electrode and the drain electrode. In the whole process, the graphene layer directly contacts the photoresist used in the photolithography technology. As a result, during dissolving the photoresist, some of the photoresist will remain on the surface of the graphene layer, so that the graphene layer fails to contact the source electrode and the drain electrode completely, and leading to an increase of the contact resistance increase between the source electrode/drain electrode and the graphene layer.

In the method according to the preferred embodiment of the present invention, the patterns of the source and the drain are defined on the metal layer by photolithography, the graphene layer will not contact the photoresist, so that the problem of the photoresist remaining on the surface of the graphene layer during dissolving the photoresist is avoided. At the same time, the metal layer comprises titanium metal and gold metal, the target metals for the source and the drain. When depositing the gold metal in the positions corresponding to the source and the drain by magnetron sputtering or electron beam evaporation technology, it is unnecessary to remove the metal layer in the relative positions of the source and the drain. Therefore, the metal layer protects the graphene in the whole process of manufacturing the graphene thin-film transistor, and it is ensured that the graphene layer contact the source electrode and drain electrode sufficiently, and thus the contact resistance between the source electrode/drain electrode and the graphene layer is reduced.

Figure 3:
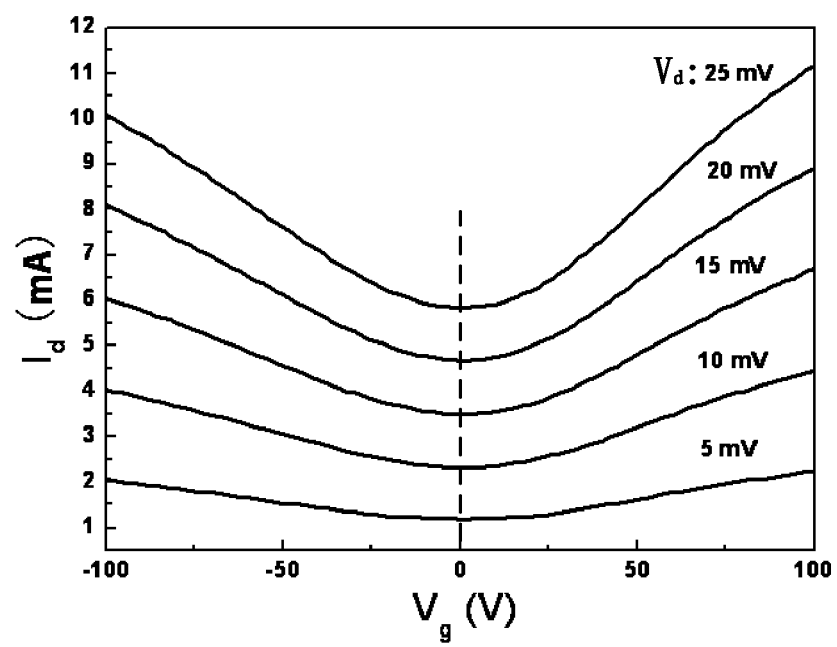
FIG. 3 is a transfer function graph of a back gate of a graphene thin-film transistor manufactured by the manufacturing method of the present invention.

After manufacturing the graphene thin-film transistor, a transform function graph of a back gate of the graphene thin-film transistor is tested. Please refer to FIG. 3, the longitudinal axis indicates a drain current (Id), the unit is mA; the horizontal axis indicates a gate voltage (Vg) the unit is volts. The source is grounded during testing the transform function graph of the back gate. As shown in the FIG. 3, for different drain voltages (Vd), all of the minimum values of the drain currents appears in the location of Vg=0. This shows that the graphene in the channel region of the graphene thin-film transistor is not doped, which means there are not any impurities remaining on the surface of the graphene layer. The intrinsic characteristic is good. In the prior art method, the PMMA, the photoresist, and other impurities remain on the surface of the graphene. The minimum value of the drain current appears at a location with a voltage value less or more than 0V. The bipolar symmetric of a graphene field effect device is broken, so that the contact resistance between the source/drain and the graphene is increased. It can also be observed from the drawing, under a condition that Vg is constant, when the drain voltage (Vd) increases in increments of 5 mv continuously, the drain current (Id) substantially increases in equivalent increments. That is, the drain current (Id) is proportional to the drain voltage (Vd), it means that the graphene thin-film transistor has excellent electrical performances.

In the method for manufacturing the graphene thin-film transistor provided by the preferred embodiment of the present invention, the metal layer with a thickness of 10 nm is deposited on the surface of the graphene layer, so that the graphene layer and the support layer do not contact the photoresist used in the subsequent process, thus a problem of residues on the surface of the graphene is avoided, and the source electrode and the drain electrode contact the graphene layer completely, the contact resistance between the source electrode/drain electrode and the graphene is reduced, and the current in the graphene thin-film transistor is increased. This solves the problem that the contact resistance between the source electrode/drain electrode and the graphene is increased due to the remaining PMMA and the photoresist on the surface of the graphene in the conventional manufacturing method.

In addition, t the surface of the graphene layer has an undulation less than 0.1 nm in the manufactured graphene thin-film transistor manufactured by the method according to the preferred embodiment of the present invention. Such an undulation is far less than the surface undulation of 1 nm of the graphene layer in the graphene thin-film transistor manufactured by the prior art. As can be seen, the graphene thin-film transistor manufactured by the manufacturing method of the preferred embodiment has more excellent electrical performances.

The present invention has been described by the preferred embodiments above. However, it is understood that the present invention is not limited by the above preferred embodiments, and many changes and modifications can be carried out without departing from the scope and the spirit of the invention that is intended to be limited only by the appended claims.

What is claimed is:

1. A method for manufacturing a graphene thin-film transistor, comprising:
   S1: depositing a graphene layer on a surface of a copper foil by chemical vapor deposition using methane as a carbon source;
   S2: depositing a metal layer on a surface of the graphene layer;
   S3: attaching a support layer to a surface of the metal layer to form a graphene film;
   S4: placing the graphene film in a copper etching solution, immersing the support layer partially in the copper etching solution, and immersing the metal layer, the graphene layer, and copper foil in the copper etching solution completely until the copper foil is dissolved completely, then transferring the graphene film, from which the copper foil has been removed, to a target substrate, and removing the support layer, wherein a density of the support layer is less than a density of the copper etching solution; and
   S5: defining patterns of a source and a drain on the surface of the metal layer, manufacturing a source electrode and a drain electrode, and manufacturing a gate electrode at a side of the target substrate away from the graphene layer, to obtain a graphene thin-film transistor;
   wherein the metal layer comprises a first metal layer and a second metal layer, the first metal layer close to the surface of the graphene layer is a titanium metal layer, and the second metal layer away from the surface of the graphene layer is a gold metal layer.

2. The method for manufacturing the graphene thin-film transistor of claim 1, wherein before S1, the method further comprises: washing the copper foil in ethanol, acetone, and dilute hydrochloric acid of 0.5 mol/L sequentially.

3. The method for manufacturing the graphene thin-film transistor of claim 1, wherein the metal layer is deposited on the surface of the graphene layer by electron beam evaporation or magnetron sputtering.

4. The method for manufacturing the graphene thin-film transistor of claim 1, wherein the metal layer has a thickness of 5 nm-50 nm.

5. The method for manufacturing the graphene thin-film transistor of claim 4, wherein the metal layer comprises a single metal layer or a composite metal layer.

6. The method for manufacturing the graphene thin-film transistor of claim 5, wherein every one of the composite metal layer has the same thickness when the metal layer comprises the composite metal layer.

7. The method for manufacturing the graphene thin-film transistor of claim 5, wherein the metal layer uses a metal including titanium, gold, nickel, palladium, or platinum.

8. The method of manufacturing the graphene thin-film transistor of claim 1, wherein the support layer comprises polyurethane.

9. The method for manufacturing the graphene thin-film transistor of claim 1, wherein the target substrate comprises an insulation layer, wherein a material of the insulation layer includes silicon dioxide, silicon carbide, glass, or sapphire.

10. A method for manufacturing a graphene thin-film transistor, comprising:
    S1: depositing a graphene layer on a surface of a copper foil;
    S2: depositing a metal layer on a surface of the graphene layer;
    S3: attaching a support layer to a surface of the metal layer to form a graphene film;
    S4: placing the graphene film in a copper etching solution, immersing the support layer partially in the copper etching solution, and immersing the metal layer, the graphene layer, and the copper foil in the copper etching solution completely until the copper foil is dissolved completely, then transferring the graphene film, from which the copper foil has been removed, to a target substrate, and removing the support layer, wherein a density of the support layer is less than a density of the copper etching solution; and S5: defining patterns of a source and a drain on the surface of the metal layer, manufacturing a source electrode and a drain electrode, and manufacturing a gate electrode at a side of the target substrate away from the graphene layer, to obtain a graphene thin-film transistor;

wherein the metal layer comprises a first metal layer and a second metal layer, the first metal layer close to the surface of the graphene layer is a titanium metal layer, and the second metal layer away from the surface of the graphene layer is a gold metal layer.

11. The method for manufacturing the graphene thin-film transistor of claim 10, before S1, further comprising: washing the copper foil in ethanol, acetone, and dilute hydrochloric acid of 0.5 mol/L sequentially.

12. The method for manufacturing the graphene thin-film transistor of claim 10, wherein the graphene is deposited on the surface of the copper foil by chemical vapor deposition.

13. The method for manufacturing the graphene thin-film transistor of claim 10, wherein the metal layer is deposited on the surface of the graphene layer by electron beam evaporation or magnetron sputtering.

14. The method for manufacturing the graphene thin-film transistor of claim 10, wherein the metal layer has a thickness of 5 nm-50 nm.

15. The method for manufacturing the graphene thin-film transistor of claim 14, wherein the metal layer comprises a single metal layer or a composite metal layer.

16. The method for manufacturing the graphene thin-film transistor of claim 15, wherein the metal layer uses a metal including titanium, gold, nickel, palladium, or platinum.

17. The method of manufacturing the graphene thin-film transistor of claim 10, wherein the support layer comprises polyurethane.

18. The method for manufacturing the graphene thin-film transistor of claim 10, wherein the target substrate comprises an insulation layer, wherein a material of the insulation layer includes silicon dioxide, silicon carbide, glass, or sapphire.

* * * * *